United States Patent [19]
Cho

[11] Patent Number: 5,499,602
[45] Date of Patent: Mar. 19, 1996

[54] APPARATUS FOR MANFUACTURING A SEMICONDUCTOR LAYER USING RAPID THERMAL PROCESSING

[75] Inventor: Byung J. Cho, Bubaleub, Rep. of Korea

[73] Assignee: Hyundai Electronics Industries Co., Ltd., Kyoungkido, Rep. of Korea

[21] Appl. No.: 447,916

[22] Filed: May 23, 1995

[30]  Foreign Application Priority Data

May 25, 1994 [KR] Rep. of Korea ............... 1994-11439

[51] Int. Cl.$^6$ ............................................. B05C 11/00
[52] U.S. Cl. ................. 118/712; 118/666; 118/668; 118/708; 118/723 MW; 118/725
[58] Field of Search ........................ 118/723 MW, 118/725, 712, 666, 668, 708

[56]  References Cited

U.S. PATENT DOCUMENTS 5,134,965  8/1992  Tokuda ..................... 118/723 MW
5,364,519  11/1994  Fujimura ................... 118/723 MW
5,433,789  7/1995  Kakehi ..................... 118/723 MW

*Primary Examiner*—Richard Bueker
*Attorney, Agent, or Firm*—Merchant & Gould, Smith, Edell, Welter & Schmidt

[57]  ABSTRACT

An apparatus for manufacturing a semiconductor layer using rapid thermal processing, the apparatus comprising: a chamber for processing a wafer; a first microwave source for appling microwave to a center portion of said wafer, being formed on one side of said chamber; and a second microwave source for appling microwave to the edge portion of said wafer, being formed on the other side of said processing chamber; a gas inlet for injecting a processing gas into said processing chamber, being formed in top of said processing chamber; a gas outlet for exhausting said processing gas in said processing chamber.

6 Claims, 3 Drawing Sheets

APPARATUS FOR MANFUACTURING A SEMICONDUCTOR LAYER USING RAPID THERMAL PROCESSING

BACKGROUND OF THE INVENTION

1. Field of the Invention

The present invention relates to an apparatus for manufacturing a semiconductor layer, by performing rapid thermal processing(RTP), and more particularly, to an apparatus capable of heating the wafer rapidly, exactly and uniformly and measuring the heating temperature of the wafer by measuring the length of the expansion of the wafer.

2. Description of the Prior Art

In a conventional apparatus for processing the wafer, it heats the wafer using light energy from a lamp. Light energy is converted into thermal energy which is absorbed in the wafer, so that thermal energy is transmitted to all areas on the wafer. Also, the temperature of the wafer is measured by using thermal energy radiated from the wafer as a pyrometer.

However, in the conventional apparatus, since the wafer has a non-uniform surface due to films and patterns, which are formed on the wafer, light energy is non-uniformly absorbed in the wafer. Also, the temperature of the wafer can't be exactly measured because thermal energy is non-uniformly radiated in accordance with films deposited on the wafer, impurity levels, the chamber reflect ratio, surface roughness, and the like.

SUMMARY OF THE INVENTION

Therefore, an object of the present invention is to provide an apparatus for manufacturing a semiconductor layer performing rapid thermal processing.

Another object of the present invention is to provide an apparatus capable of heating the wafer rapidly, exactly and uniformly by measuring the heating temperature of the wafer.

According to an aspect of the present invention, there is provided an apparatus for manufacturing a semiconductor layer using rapid thermal processing, the apparatus comprising: a chamber for processing a wafer; a first means for appling microwave to a center portion of said wafer, being formed on one side of said chamber; and a second means for appling microwave to the edge portion of said wafer, being formed on the other side of said processing chamber; means for injecting a processing gas into said processing chamber, being formed in top of said processing chamber; means for exhausting said processing gas in said processing chamber.

BRIEF DESCRIPTION OF THE DRAWING

The accompanying drawings, which are incorporated in and constitute a part of the specification, illustrate presently preferred embodiments of the invention, and together with the general description given above and detailed description of the preferred embodiments given below, serve to explain the principles of the invention.

DETAILED DESCRIPTION OF THE PREFERRED EMBODIMENTS

Figure 1:
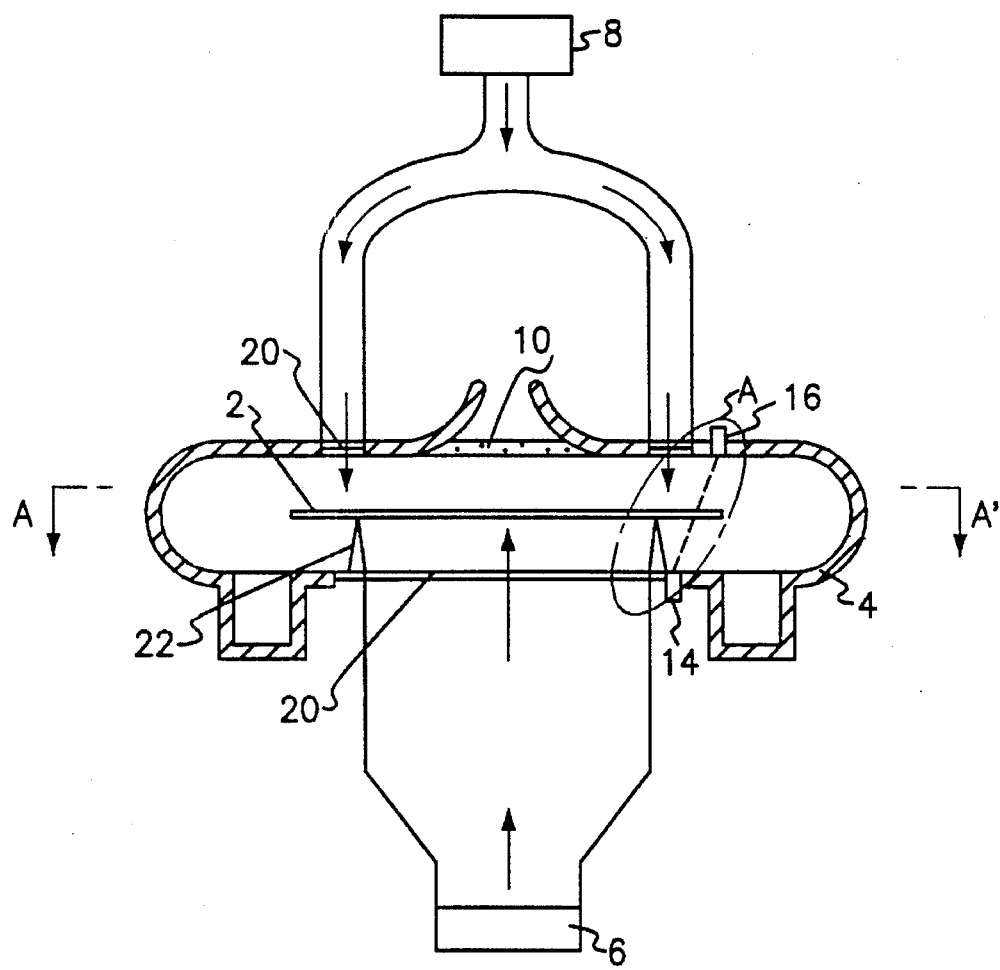
FIG. 1 is a sectional view roughly showing the RTP reactor for processing the semiconductor layers, according to the present invention.

Hereinafter, an embodiment of the present invention will be described referring to the drawings.

FIG. 1 is a sectional view roughly showing the RTP reactor for processing the semiconductor layers, according to the present invention. As shown in FIG. 1, the center portion and edge portion of a wafer 2 are heated by a first microwave source 6 and a second microwave source 8, respectively.

In this embodiment, a microwave having the frequency of 2.45 GHz is used and a blocking wall 20, such as alumina, is used for isolating the reacting chamber from the microwave source.

A top view of the wave guide inducing the microwave from the second microwave source 8 shows round along the edge of the wafer. A cross-sectional view of the wave guide shows a splitted wave guide which is divided into two wave guides at a processing chamber 4.

Also, each of the two regions on the wafer is independently heated by each of the first and second microwave sources, 6 and 8, thereby preventing a thermal distribution on the wafer 2 from varying frequently, and uniformly heating the wafer.

The processing chamber 4 is constructed form stainless steel having a flat cylindrical shape. Water is circulated around the processing chamber 4 for cooling purposes. The edge of the processing chamber 4 is constructed into a round shape to prevent the processing gas from being congested in the corner of the processing chamber 4.

In the case where the PTCVD(rapid thermal Chemical vapor deposition) processing is performed, the processing gas is injected onto the wafer, which is mounted on a quartz pin 22, and the gas is perpendicularly injected through a gas inlet 10, like a gas shower.

Also, gas outlets 12 are uniformly formed so that the injection gas is uniformly distributed in the chamber and reacts on the wafer 2.

Since the power density of the second microwave source 8 is spread onto the edge of the wafer and the power density on the edge of the wafer is half of that of the second microwave source 8, the power density of the second microwave source 8 is two times as high as that of the first microwave source 6, so that the power density on the entire area of the wafer is the same.

Figure 2:
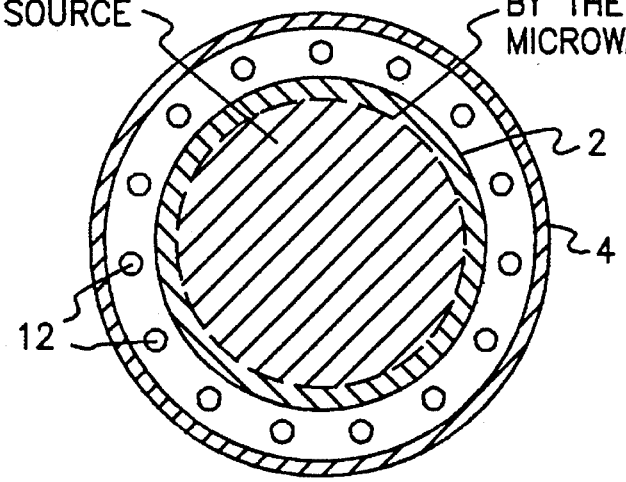
FIG. 2 is a sectional view roughly showing section A–A' in FIG. 1.

FIG. 2 is a sectional view roughly showing section A–A' in FIG. 1. For example, as shown in FIG. 2, assuming that the maximum power density of the first microwave source 6 may be proximately 10 $W/cm^2$ and the maximum power density of the second microwave source 8 may be proximately 20 $W/cm^2$, the first microwave source 6 heats a region between the center of the wafer and 0.9 R (R is a wafer diameter), the second microwave source 8 heats another region which has an area between 0.9 R and R.

Figure 3A:
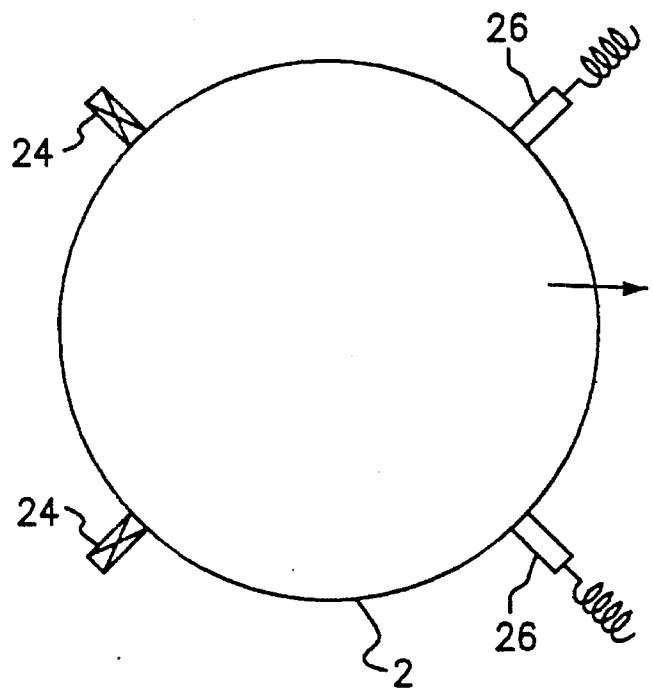
FIG. 3A is a top view roughly showing the wafer fitting unit for measuring the temperature of the wafer.

FIG. 3A is a top view roughly showing the wafer fitting unit for measuring the temperature of the wafer. As shown in FIG. 3A, a fitting unit 24 is formed at the one side of the wafer 2 and fits the wafer 2 to the processing chamber 4. On the other hand, the springs 26 are formed on the other side of the wafer 2 so that the springs 26 push the wafer 2 and may be diminished by the expansion of the wafer, according to the increasing temperature.

Figure 3B:
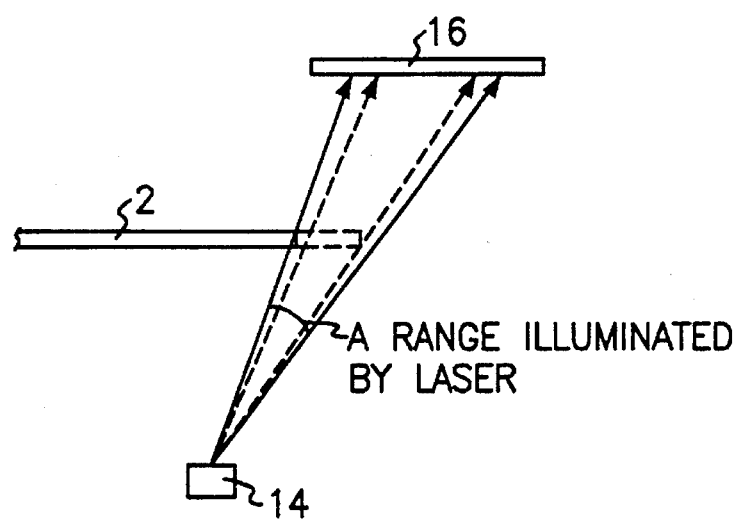
FIG. 3B is an enlarged view of A portion in FIG. 1.

FIG. 3B is an enlarged view of A portion in FIG. 1. As shown in FIG. 3B, a laser illuminating unit 14 is formed below the wafer 2, and a light detecting unit 16 is formed on the wafer 2 in corresponding to the laser illuminating unit 14.

The laser illuminated from the laser illuminating unit 14 is detected by the light detecting unit 16, whereby the expansion size of the wafer 2 may be measured and the temperature of the wafer 2 can be also measured.

For example, when the crystal direction of a wafer is (100), the thermal expansion coefficient is $4.16 \times 10^{-6}$ m/c. Therefore, with respect to the temperature variation of 1000° C., the wafer having a 266 mm diameter can be expanded up to 832 μm. Accordingly, the light detecting unit 16 must detect the wafer variation of 0.8 μm in order to detect the wafer temperature variation of 1° C.

The light detecting unit measures a reverse current of the diode in accordance with the amount of incident light, thereby detecting the temperature of the wafer with an analog signal. Furthermore, a plurality of diodes can be arranged to detect the temperature of the wafer.

Figure 4:
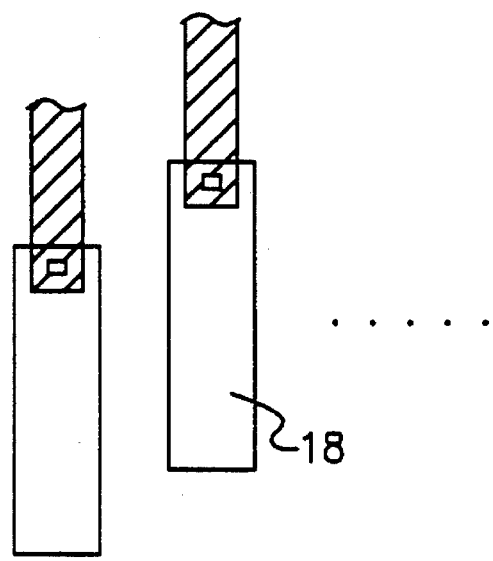
FIG. 4 is a top view roughly showing an array of light receiving diodes for measuring the temperature of the wafer which is extend.
Figure 4:
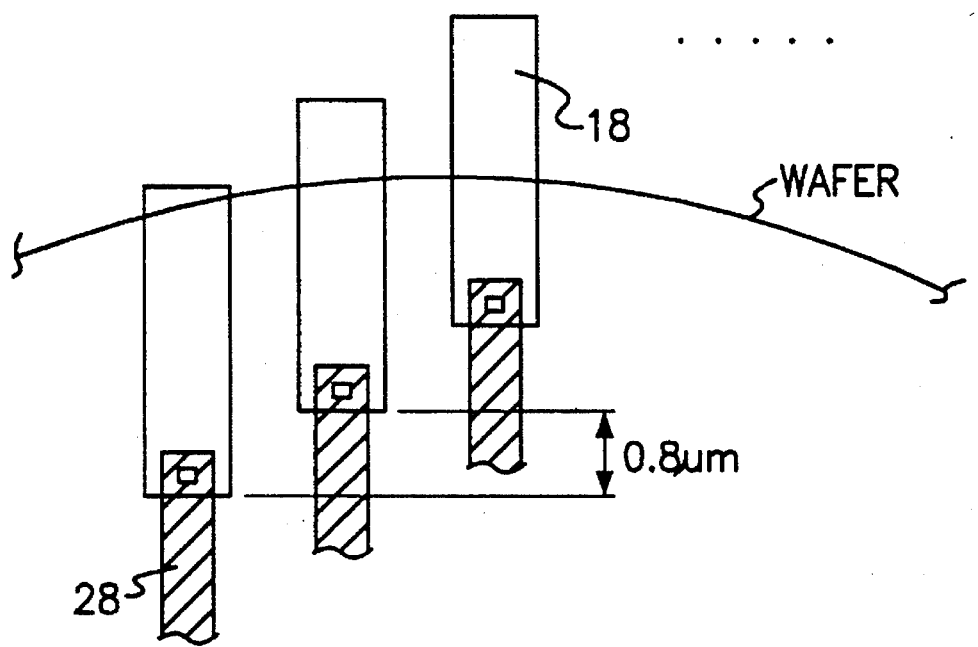

FIG. 4 is a top view roughly showing an array of light receiving diodes for measuring the temperature of the wafer which is extend. As shown in FIG. 4, each of light receiving diodes 18 in the light detecting unit 16 makes contact with each of metal lines 28. Also, the light receiving diodes 18 consist of two groups, each of which has 600 light receiving diodes which are separated by spaces. A distance of between the light receiving diodes 18 is 0.8 μm in a radial direction.

The light receiving diodes 18, receiving the light from the laser illuminating unit 14, generate a current. In the case where light illuminates some area of one of the light receiving diodes 18 and the illuminated area is larger than half of its entire area, a predetermined current will not be generated in it and the light receiving diode 18 is then set to "ON".

An ON signal from the light receiving diodes 18 means that the temperature of the wafer has risen by 1° C. Accordingly, the light receiving diode 18, in accordance with the present invention, can measure the temperature of the wafer up to 1200° C.

Furthermore, if the number of the light receiving diodes 18, which are set ON, is measured the exact temperature of the wafer can be readily measured.

As stated above, the present invention has an effect in that the wafer is uniformly heated by the microwave and the temperature of the wafer can be exactly measured and controlled by measuring expansion of the wafer regardless of the state of the wafer.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An apparatus for manufacturing a semiconductor layer using rapid thermal processing, the apparatus comprising:

a chamber for processing a wafer;

a first means for appling microwave to a center portion of said wafer, being formed on one side of said chamber; and a second means for appling microwave to the edge portion of said wafer, being formed on the other side of said processing chamber;

means for injecting a processing gas into said processing chamber, being formed in top of said processing chamber;

means for exhausting said processing gas in said processing chamber.

2. An apparatus according to claim 1, further comprising means for illuminating light to the edge of said wafer in order to measure the expansion of said wafer and a light detecting means for detecting light from said light illuminating means.

3. An apparatus according to claim 2, wherein said light detecting means has a receiving diode which measures a reverse current in accordance with the amount of light.

4. An apparatus according to claim 2, wherein said light detecting means comprises a plurality of receiving diodes which are arranged in radial direction of said wafer, and are separated by spaces; and means for detecting each signal which is generated when a half of the area of one of said receiving diodes is shielded by the extension of said wafer.

5. An apparatus according to claim 4, wherein the distance between said receiving diodes is approximately 0.8 μm in radial direction of said wafer.

6. An apparatus according to claim 1, wherein the corner of said processing chamber is round to prevent said processing gas from being congested.

* * * * *